(12) United States Patent
Sato et al.

(10) Patent No.: US 10,483,442 B2
(45) Date of Patent: Nov. 19, 2019

(54) ADDITION CURABLE TYPE SILICONE RESIN COMPOSITION, PROCESS FOR PRODUCING COMPOSITION, AND OPTICAL SEMICONDUCTOR APPARATUS

(71) Applicant: SHIN-ETSU CHEMICAL CO., LTD., Tokyo (JP)

(72) Inventors: Kazuyasu Sato, Annaka (JP); Toshiyuki Ozai, Takasaki (JP); Eiichi Tabei, Annaka (JP)

(73) Assignee: SHIN-ETSU CHEMICAL CO., LTD., Tokyo (JP)

( * ) Notice: Subject to any disclaimer, the term of this patent is extended or adjusted under 35 U.S.C. 154(b) by 0 days.

(21) Appl. No.: 15/770,505

(22) PCT Filed: Oct. 28, 2016

(86) PCT No.: PCT/JP2016/004743
§ 371 (c)(1),
(2) Date: Apr. 24, 2018

(87) PCT Pub. No.: WO2017/081850
PCT Pub. Date: May 18, 2017

(65) Prior Publication Data
US 2018/0315906 A1 Nov. 1, 2018

(30) Foreign Application Priority Data
Nov. 13, 2015 (JP) .................. 2015-222567

(51) Int. Cl.
| | | |
|---|---|---|
| C08G 77/58 | (2006.01) | |
| C08L 83/14 | (2006.01) | |
| H01L 23/29 | (2006.01) | |
| H01L 23/31 | (2006.01) | |
| H01L 33/56 | (2010.01) | |
| H01L 51/00 | (2006.01) | |
| H01L 51/52 | (2006.01) | |

(52) U.S. Cl.
CPC .............. *H01L 33/56* (2013.01); *C08L 83/14* (2013.01); *H01L 23/29* (2013.01); *H01L 23/31* (2013.01); *H01L 51/0094* (2013.01); *H01L 51/5246* (2013.01); *C08G 77/58* (2013.01); *C08L 2201/10* (2013.01); *C08L 2203/206* (2013.01); *C08L 2205/02* (2013.01); *C08L 2314/08* (2013.01); *H01L 2933/005* (2013.01)

(58) Field of Classification Search
CPC ... H01L 83/14; H01L 2933/005; H01L 33/56; H01L 51/00; H01L 51/52; H01L 51/0094; H01L 51/5246; C08L 83/14; C08L 2201/10; C08L 2205/02; C08L 2203/206; C08G 77/58
USPC ...................................................... 257/791
See application file for complete search history.

(56) References Cited

U.S. PATENT DOCUMENTS

| | | | |
|---|---|---|---|
| 3,159,601 A | 12/1964 | Ashby et al. | |
| 3,159,662 A | 12/1964 | Ashby et al. | |
| 3,220,972 A | 11/1965 | Lamoreaux et al. | |
| 3,775,452 A | 11/1973 | Karstedt et al. | |
| 4,560,784 A | 12/1985 | Mori et al. | |
| 5,543,450 A | 8/1996 | Takita et al. | |
| 7,838,117 B2* | 11/2010 | Miyoshi ............... | H01L 33/56 428/447 |
| 9,105,821 B2* | 8/2015 | Kobayashi ............ | C08L 83/08 |
| 9,117,978 B2* | 8/2015 | Kashiwagi ............ | B32B 3/16 |
| 2002/0161140 A1 | 10/2002 | Yoneda et al. | |
| 2004/0116640 A1 | 6/2004 | Miyoshi | |
| 2009/0258216 A1 | 10/2009 | Yamakawa et al. | |
| 2012/0043577 A1* | 2/2012 | Imazawa ............... | C08L 83/04 257/99 |
| 2014/0175504 A1* | 6/2014 | Kobayashi ............ | C08L 83/08 257/100 |
| 2014/0275384 A1 | 9/2014 | Takahashi | |
| 2015/0038497 A1* | 2/2015 | Lewis .................. | C07D 513/06 514/224.2 |

(Continued)

FOREIGN PATENT DOCUMENTS

| | | | | |
|---|---|---|---|---|
| EP | 3360928 A1 * | 8/2018 | ............ | H01L 23/29 |
| JP | S60-163966 A | 8/1985 | | |

(Continued)

OTHER PUBLICATIONS

May 15, 2018 International Preliminary Report on Patentability issued in International Patent Application No. PCT/JP2016/004743.
Jan. 15, 2019 Office Action issued in Japanese Patent Application No. 2015-222567.
Mar. 20, 2019 Office Action issued in Taiwanese Application No. 105136357.
Apr. 2, 2019 extended European Search Report issued in European Application No. 16863817.9.

(Continued)

*Primary Examiner* — Alexander O Williams
(74) *Attorney, Agent, or Firm* — Oliff PLC

(57) ABSTRACT

An addition curable type silicone resin composition includes (a) an organopolysiloxane having an alkenyl group bonded to a silicon atom, (b) an organopolysiloxane represented by the formula, $(R^1R^2{}_2SiO_{1/2})_m(R^1R^2SiO_{2/2})_n(R^2{}_2SiO_{2/2})_p(R^1SiO_{3/2})_q(R^2(OR^3)SiO_{2/2})_r(SiO_{4/2})_s$, (c) an organohydrogen polysiloxane represented by $R^4{}_aH_bSiO_{(4-a-b)/2}$, (d) a platinum group metal catalyst, and (e) a polyorganometallosiloxane containing an Si—O—Ce bond, and an Si—O—Ti bond, and contents of Ce and Ti of which are each 50 to 5,000 ppm, which cures by heating. According to this constitution, it is provided an addition curable type silicone resin composition which can provide a cured product excellent in transparency, and less change in hardness and weight loss under high temperature conditions.

12 Claims, No Drawings

(56) References Cited

U.S. PATENT DOCUMENTS

| | | | | |
|---|---|---|---|---|
| 2015/0144987 A1* | 5/2015 | Hamamoto | ............. | C08L 83/04 257/100 |
| 2015/0252192 A1* | 9/2015 | Kobayashi | ............. | C08L 83/08 428/447 |
| 2015/0299543 A1* | 10/2015 | Miyamoto | ............. | C08L 83/04 257/100 |
| 2015/0376344 A1 | 12/2015 | Dent et al. | | |
| 2016/0009866 A1* | 1/2016 | Swier | ................... | C09D 183/10 528/43 |
| 2016/0194496 A1 | 7/2016 | Okawa et al. | | |
| 2016/0306076 A1* | 10/2016 | Rong | .................... | C08G 77/20 |
| 2017/0029571 A1* | 2/2017 | Kusunoki | ................ | C08K 5/56 |
| 2017/0066886 A1* | 3/2017 | Kitazawa | ................ | C08L 83/04 |
| 2017/0114226 A1* | 4/2017 | Tasaki | ..................... | B29C 45/14 |
| 2017/0190878 A1* | 7/2017 | Iimura | ...................... | C07F 7/08 |
| 2017/0355804 A1* | 12/2017 | Fujisawa | ................. | C08K 3/00 |

FOREIGN PATENT DOCUMENTS

| | | |
|---|---|---|
| JP | S63-268765 A | 11/1988 |
| JP | H01-272682 A | 10/1989 |
| JP | H11-001619 A | 1/1999 |
| JP | 2002-265787 A | 9/2002 |
| JP | 2004-186168 A | 7/2004 |
| JP | 2008-291148 A | 12/2008 |
| TW | 350864 B | 1/1999 |
| WO | 2013/084699 A1 | 6/2013 |
| WO | 2013/192404 A1 | 12/2013 |
| WO | 2013/192419 A1 | 12/2013 |
| WO | 2014/130784 A1 | 8/2014 |
| WO | 2015/033979 A1 | 3/2015 |

OTHER PUBLICATIONS

Jan. 31, 2017 International Search Report issued in International Patent Application No. PCT/JP2016/004743.

Jun. 10, 2019 Office Action issued in Korean Patent Application No. 10-2018-7013520.

Aug. 6, 2019 Office Action issued in Japanese Patent Application No. 2015-222567.

* cited by examiner

ADDITION CURABLE TYPE SILICONE RESIN COMPOSITION, PROCESS FOR PRODUCING COMPOSITION, AND OPTICAL SEMICONDUCTOR APPARATUS

TECHNICAL FIELD

The present invention relates to an addition curable type silicone resin composition suitable for an optical use such as a sealing material of a light emission diode (LED) device and the like, a process for producing the composition, and an optical semiconductor apparatus using the composition as a sealing material.

BACKGROUND ART

An epoxy resin has generally been used as a sealing material of an LED device, and it has been proposed to use a silicone resin as a sealing material instead of the epoxy resin (Patent Documents 1 to 3). The silicone resin is excellent in heat resistance, weather resistance, and discoloration resistance as compared with those of the epoxy resin, so that it has been mainly used particularly for blue LED and white LED.

However, in recent years, the temperature around the LED device has increased with the increase in the amount of electricity supplied to the LED, and even when the silicone resin is used, the sealing material is degraded whereby the problems are generated that cracks are generated or light transmittance is lowered due to discoloration. Under such a background, in recent years, long-term reliability (i.e., heat resistance) in a high-temperature environment is required for a sealing material of the LED device.

As a general silicone material improved in heat resistance, there has heretofore been reported a heat resistant organopolysiloxane composition in which a reaction product of an organopolysiloxane, a carboxylic acid salt of cerium, and a titanium compound or a zirconia compound obtained by subjecting to heat treatment at a temperature of 150° C. or higher is added as an additive to an organopolysiloxane which becomes a base (Patent Document 4), or a silicone gel composition to which the same additive has been added (Patent Document 5). However, the materials disclosed in these Patent Documents are not an addition curable type silicone resin composition which gives a cured product having rubber hardness, and accordingly, these are not a material that can be used for the uses such as a sealing material of the LED device and the like.

On the other hand, in Patent Document 6, a heat resistant silicone rubber composition containing a mixture of rare earth salts of 2-ethylhexanoic acid has been reported, and it has also been reported that a total light transmittance of a sheet with a thickness of 2 mm at a wavelength of 600 nm is 90% or more. However, this heat resistant silicone rubber composition had a problem that light transmittance of short wavelength light around a wavelength of 400 nm was inferior.

CITATION LIST

Patent Documents

Patent Document 1: Japanese Patent Laid-Open Publication No. H11-001619
Patent Document 2: Japanese Patent Laid-Open Publication No. 2002-265787
Patent Document 3: Japanese Patent Laid-Open Publication No. 2004-186168
Patent Document 4: Japanese Patent Laid-Open Publication No. S60-163966
Patent Document 5: Japanese Patent Laid-Open Publication No. 2008-291148
Patent Document 6: WO2013/084699

SUMMARY OF INVENTION

Technical Problem

The present invention was made to solve the problems, and has an object to provide an addition curable type silicone resin composition which can provide a cured product excellent in transparency, and less change in hardness and weight loss under high temperature conditions.

Solution to Problem

In order to solve the problems, the present invention provides an addition curable type silicone resin composition which comprises (a) an organopolysiloxane having two or more alkenyl groups bonded to a silicon atom(s) in one molecule, and having a viscosity at 25° C. of 50 to 100,000 mPa·s, (b) an organopolysiloxane represented by the following average composition formula (1), and is a liquid having a viscosity at 25° C. of 1,000 Pa·s or more or a solid: an amount of the component (b) being more than 0 part by mass and less than 80 parts by mass based on 100 parts by mass of a total of the component (a) and the component (b), $$(R^1R^2{}_2SiO_{1/2})_m(R^1R^2SiO_{2/2})_n(R^2{}_2SiO_{2/2})_p(R^1SiO_{3/2})_q(R^2(OR^3)SiO_{2/2})_r(SiO_{4/2})_s \quad (1)$$
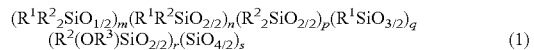

wherein, $R^1$ represents a monovalent hydrocarbon group which may contain an alkenyl group; $R^2$ represents a monovalent hydrocarbon group which does not contain an alkenyl group, and 80% or more of the whole $R^2$ is a methyl group; $R^3$ represents a hydrogen atom or an alkyl group; "m", "n", "p", "q", "r", and "s" are numbers satisfying m≥0, n≥0, p≥0, q≥0, r≥0, s≥0, and are numbers satisfying m+n>0, q+r+s>0, m+n+p+q+r+s=1, (c) an organohydrogen polysiloxane represented by the following average composition formula (2), having two or more SiH bonds in one molecule, and having a viscosity at 25° C. of 1,000 mPa·s or less: in an amount that a number of the SiH bonds of the component (c) being 0.5 to 5.0-fold based on a total of a number of the alkenyl groups of the component (a) and the component (b), $$R^4{}_aH_bSiO_{(4-a-b)/2} \quad (2)$$

wherein, $R^4$ represents a monovalent hydrocarbon group which does not contain an alkenyl group, and 50% or more of the whole $R^4$ is a methyl group; and "a" and "b" are numbers satisfying 0.7≤a≤2.1, 0.001≤b≤1.0, and 0.85≤a+b≤3.0, (d) a platinum group metal catalyst: in an amount of 1 to 500 ppm in terms of a mass of metal atoms based on a total of the components (a) to (c), and (e) a polyorganometallosiloxane containing an Si—O—Ce bond, and an Si—O—Ti bond, a Ce content of which is 50 to 5,000 ppm, a Ti content of which is 50 to 5,000 ppm, and having a viscosity at 25° C. of 10 to 10,000 mPa·s: in an amount of 0.01 to 5 parts by mass based on 100 parts by mass of a total of the components (a) to (d), which cures by heating.

When such an addition curable type silicone resin composition is employed, it becomes an addition curable type silicone resin composition which can provide a cured product excellent in transparency, and has less change in hardness and weight loss under high temperature conditions.

In addition, the addition curable type silicone resin composition is preferably a material having a total light transmittance of a sheet having a thickness of 2 mm of a cured product of the composition at a wavelength of 400 nm of 80% or more, and a weight reduction ratio of the cured product after storage at 250° C. for 500 hours of within 10%.

When such an addition curable type silicone resin composition is employed, it provides a cured product having transparency and heat resistance, which are particularly suitable for LED applications.

In the present invention, it is also provided a process for producing the addition curable type silicone resin composition by mixing the components (a) to (e), wherein
the component (e) is
a polyorganometallosiloxane obtained by subjecting a mixture comprising
(i) an organopolysiloxane having a viscosity at 25° C. of 10 to 10,000 mPa·s: 100 parts by mass,
(ii) a rare earth carboxylate containing a cerium carboxylate represented by the following general formula (e-1): with an amount that a mass of cerium is 0.05 to 5 parts by mass based on 100 parts by mass of the component (i):

$$(R^5COO)_xCe \quad (e-1)$$

wherein, each of $R^5$s represents the same or different kind of monovalent hydrocarbon group; and "x" is 3 or 4, and
(iii) a titanium compound represented by the following general formula (e-2) and/or or its partial hydrolyzed condensate: with an amount that a mass of titanium is 0.05 to 5 parts by mass based on 100 parts by mass of the component (i),

$$(R^6O)_4Ti \quad (e-2)$$

wherein, each of $R^6$s represents the same or different kind of monovalent hydrocarbon group,
to heat treatment at a temperature of 150° C. or higher.

When such a producing method is employed, a polyorganometallosiloxane (i.e., the component (e)) containing predetermined amounts of the Ce content and the Ti content can be easily synthesized, so that the addition curable type silicone resin composition of the present invention can be easily produced.

In addition, the present invention further provides an optical semiconductor apparatus in which a light emitting diode is sealed by the addition curable type silicone resin composition.

When such an optical semiconductor apparatus is employed, a light emitting diode is sealed by the addition curable type silicone resin composition of the present invention which gives a cured product having excellent transparency and less change in hardness and weight loss under high temperature conditions, so that it becomes an optical semiconductor apparatus excellent in reliability under high temperature conditions.

Advantageous Effects of Invention

According to the addition curable type silicone resin composition of the present invention, it becomes an addition curable type silicone resin composition which gives a cured product excellent in transparency and heat discoloration resistance, having a suitable rubber hardness, having less change in hardness and weight loss under high temperature conditions, and having good crack resistance. Accordingly, the addition curable type silicone resin composition of the present invention is particularly useful as a material for protecting and sealing LED devices, a material for changing and adjusting wavelengths, constituent materials of lenses, and other materials for optical devices or optical components.

DESCRIPTION OF EMBODIMENTS

It has been desired to develop an addition curable type silicone resin composition which is can provide a cured product excellent in transparency, and has less change in hardness and weight loss under high temperature conditions.

The present inventors have intensively studied, and as a result, they have found that an addition curable type silicone resin composition containing the following components (a) to (e) is employed, the object can be accomplished and the resulting material becomes a suitable as a material for an LED, whereby they have completed the present invention.

That is, the present invention is directed to an addition curable type silicone resin composition which is an addition curable type silicone resin composition, which contains the following components (a) to (e), and cures by heating.
(a) an organopolysiloxane having two or more alkenyl groups bonded to a silicon atom(s) in one molecule, and having a viscosity at 25° C. of 50 to 100,000 mPa·s
(b) an organopolysiloxane represented by the following average composition formula (1), and is a liquid having a viscosity at 25° C. of 1,000 Pa·s or more or a solid: an amount of the component (b) being more than 0 part by mass and less than 80 parts by mass based on 100 parts by mass of a total of the component (a) and the component (b),

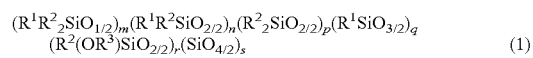
$$(R^1R^2_2SiO_{1/2})_m(R^1R^2SiO_{2/2})_n(R^2_2SiO_{2/2})_p(R^1SiO_{3/2})_q(R^2(OR^3)SiO_{2/2})_r(SiO_{4/2})_s \quad (1)$$

wherein, $R^1$ represents a monovalent hydrocarbon group which may contain an alkenyl group; $R^2$ represents a monovalent hydrocarbon group which does not contain an alkenyl group, and 80% or more of the whole $R^2$ is a methyl group; $R^3$ represents a hydrogen atom or an alkyl group; "m", "n", "p", "q", "r", and "s" are numbers satisfying m≥0, n≥0, p≥0, q≥0, r≥0, s≥0, and are numbers satisfying m+n>0, q+r+s>0, m+n+p+q+r+s=1,
(c) an organohydrogen polysiloxane represented by the following average composition formula (2), having two or more SiH bonds in one molecule, and having a viscosity at 25° C. of 1,000 mPa·s or less: in an amount that a number of the SiH bonds of the component (c) being 0.5 to 5.0-fold based on a total of a number of the alkenyl groups of the component (a) and the component (b),

$$R^4_aH_bSiO_{(4-a-b)/2} \quad (2)$$

wherein, $R^4$ represents a monovalent hydrocarbon group which does not contain an alkenyl group, and 50% or more of the whole $R^4$ is a methyl group; and "a" and "b" are numbers satisfying 0.7≤a≤2.1, 0.0015≤b≤1.0, and 0.8≤a+b≤3.0
(d) a platinum group metal catalyst: in an amount of 1 to 500 ppm in terms of a mass of metal atoms based on a total of the components (a) to (c)
(e) a polyorganometallosiloxane containing an Si—O—Ce bond, and an Si—O—Ti bond, a Ce content of which is 50 to 5,000 ppm, a Ti content of which is 50 to 5,000 ppm, and having a viscosity at 25° C. of 10 to 10,000 mPa·s: in an amount of 0.01 to 5 parts by mass based on 100 parts by mass of a total of the components (a) to (d).

In the following, the present invention will be explained in more detail, but the present invention is not limited by these. In the present specification, "Me" represents a methyl group, and "Vi" represents a vinyl group.

<Addition Curable Type Silicone Resin Composition>

In the following, each component is explained in more detail.

[Component (a)]

The component (a) is an organopolysiloxane having two or more alkenyl groups bonded to the silicon atom(s) in one molecule, and a viscosity at 25° C. of 50 to 100,000 mPa·s, and the component (a) is a necessary component to afford stress relaxation after curing in the addition curable type silicone resin composition of the present invention. The component (a) is typically a linear organopolysiloxane the main chain of which comprises repeating units of diorganosiloxane, and both terminals of the molecular chain of which are sealed by triorganosiloxy groups.

Such a component (a) may be specifically exemplified by an organopolysiloxane represented by the following formulae. Incidentally, R is preferably a methyl group in the viewpoints of light resistance and heat resistance,

ViR$_2$SiO(SiR$_2$O)$_d$SiR$_2$Vi

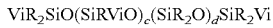ViR$_2$SiO(SiRViO)$_c$(SiR$_2$O)$_d$SiR$_2$Vi

Vi$_2$RSiO(SiR$_2$O)$_d$SiRVi$_2$

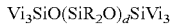Vi$_3$SiO(SiR$_2$O)$_d$SiVi$_3$

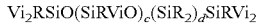Vi$_2$RSiO(SiRViO)$_c$(SiR$_2$)$_d$SiRVi$_2$

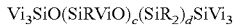Vi$_3$SiO(SiRViO)$_c$(SiR$_2$)$_d$SiVi$_3$

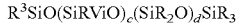R$^3$SiO(SiRViO)$_c$(SiR$_2$O)$_d$SiR$_3$ wherein, R represents a monovalent hydrocarbon group containing neither an aliphatic unsaturated group nor an aryl group, preferably a monovalent hydrocarbon group having 10 or less carbon atoms; "c" is an integer of 0 to 5; and "d" is an integer of 0 to 200.

Specific examples of the component (a) may be mentioned an organopolysiloxane represented by the following formulae,

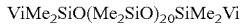ViMe$_2$SiO(Me$_2$SiO)$_{20}$SiMe$_2$Vi

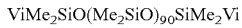ViMe$_2$SiO(Me$_2$SiO)$_{90}$SiMe$_2$Vi

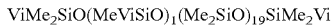ViMe$_2$SiO(MeViSiO)$_1$(Me$_2$SiO)$_{19}$SiMe$_2$Vi

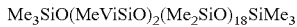Me$_3$SiO(MeViSiO)$_2$(Me$_2$SiO)$_{18}$SiMe$_3$

The viscosity of the component (a) is 50 to 100,000 mPa·s at 25° C. If the viscosity of the component (a) exceeds 100,000 mPa·s, workability at the time of sealing by using the addition curable type silicone resin composition of the present invention is worsened. On the other hand, if the viscosity of the component (a) is lower than 50 mPa·s, the component (a) becomes a material having a low boiling point so that weight loss under high temperature conditions is likely generated. The viscosity of the component (a) is preferably 1,000 to 50,000 mPa·s, further preferably 1,000 to 10,000 mPa·s.

[Component (b)]

The component (b) is an organopolysiloxane represented by the following average composition formula (1), and is a liquid having a viscosity at 25° C. of 1,000 Pa·s or more or a solid, and the component (b) is a component necessary to provide reinforcing property to the addition curable type silicone resin composition of the present invention while maintaining colorless transparency,

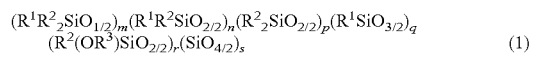

$$(R^1{}_2R^2SiO_{1/2})_m(R^1R^2SiO_{2/2})_n(R^2{}_2SiO_{2/2})_p(R^1SiO_{3/2})_q(R^2(OR^3)SiO_{2/2})_r(SiO_{4/2})_s \quad (1)$$

wherein, R$^1$ represents a monovalent hydrocarbon group which may contain an alkenyl group; R$^2$ represents a monovalent hydrocarbon group which does not contain an alkenyl group, and 80% or more of the whole R$^2$ is a methyl group; R$^3$ represents a hydrogen atom or an alkyl group; "m", "n", "p", "q", "r", and "s" are numbers satisfying m≥0, n≥0, p≥0, q≥0, r≥0, s≥0, and are numbers satisfying m+n>0, q+r+s>0, m+n+p+q+r+s=1.

The component (b) is typically a branched organopolysiloxane having a branched structure such as an R$^1$SiO$_{3/2}$ unit, an SiO$_{4/2}$ unit or the like. The component (b) is an organopolysiloxane in a liquid state having higher viscosity than that of the component (a) or a solid state. Since the component (b) may be a solid state, an upper limit of the viscosity when the component (b) is a liquid state is not particularly limited.

In the average composition formula (1), R$^1$ represents a monovalent hydrocarbon group which may contain an alkenyl group, and among these, those having 1 to 12 carbon atoms, particularly those having 1 to 6 carbon atoms are preferable. Such R$^1$ may be specifically mentioned a methyl group, an ethyl group, a propyl group, a butyl group, a cyclohexyl group, a phenyl group, a tolyl group, a vinyl group, an allyl group and the like. Also, R$^2$ represents a monovalent hydrocarbon group which does not contain the alkenyl group, among these, those having 1 to 12 carbon atoms, particularly those having 1 to 6 carbon atoms are preferable. Such R$^2$ may be specifically mentioned those in which the alkenyl group is removed from the specific examples of the R$^1$. In the all R$^2$s, 80% or more is a methyl group. Further, R$^3$ represents a hydrogen atom or an alkyl group, and the alkyl group may be preferably those having 1 to 6 carbon atoms, particularly those having 1 to 3 carbon atoms. Such R$^3$ may be specifically mentioned a methyl group, an ethyl group, a propyl group and the like.

The component (b) is preferably a material having an alkenyl group, and among the alkenyl group in the component (b), a vinyl group is most preferable from the viewpoints of availability and a cost. An amount of the alkenyl group is preferably in the range of 0.01 to 1 mol/100 g based on the solid content of the component (b), more preferably 0.05 to 0.5 mol/100 g. If the amount of the alkenyl group of the component (b) is 0.01 mol/100 g or more based on the solid content, the component (b) is sufficiently incorporated into the crosslinking, so that there is no fear that the hardness of the cured product becomes too low. In addition, if the amount of the alkenyl group of the component (b) is 1 mol/100 g or less based on the solid content, the alkenyl group in the system does not become too much, so that the formulation amount of the component (b) based on the formulation amount of the component (c) (crosslinking agent) mentioned later can be set to an appropriate amount. Accordingly, there is no fear that crosslinking does not sufficiently proceed whereby desired hardness cannot be obtained, or the cured product becomes fragile.

In the present invention, a ratio of the component (b) to the component (a) is also important, and a formulation amount of the component (b) is such an amount that the formulation amount of the component (b) becomes more than 0 part by mass and less than 80 parts by mass based on 100 parts by mass in total of the component (a) and the component (b). Since the hardness of the cured product increases as the formulation amount of the component (b) increases, it is possible to adjust the hardness by changing the formulation amount of the component (b) according to the design of the LED or the like. More specifically, for example, when stress relaxation is required for the cured product, the amount of the component (b) is preferably made such an amount that it is more than 0 parts by mass and less than 50 parts by mass based on 100 parts by mass in total of the component (a) and the component (b). On the other hand, for example, when a high hardness is required for the cured product, the amount of the component (b) is preferably made such an amount that it is 50 parts by mass or more and less than 80 parts by mass based on 100 parts by mass in total of the component (a) and the component (b).

[Component (c)]

The component (c) is an organohydrogen polysiloxane represented by the following average composition formula (2), having two or more SiH bonds in one molecule, and having a viscosity at 25° C. of 1,000 mPa·s or less, and the component (c) is a component that acts as a crosslinking agent which reacts with the alkenyl groups contained the component (a) and the component (b) by a hydrosilylation reaction and crosslinks, $$R^4_a H_b SiO_{(4-a-b)/2} \qquad (2)$$

wherein, $R^4$ represents a monovalent hydrocarbon group which does not contain an alkenyl group, and 50% or more of the whole $R^4$ is a methyl group; "a" and "b" are numbers satisfying $0.7 \le a \le 2.1$, $0.001 \le b \le 1.0$, and $0.85 \le a+b \le 3.0$.

From the viewpoint that the component (c) is a component acting as a crosslinking agent, the viscosity of the component (c) is 1,000 mPa·s or less at 25° C., preferably 0.5 to 1,000 mPa·s, and more preferably 2 to 200 mPa·s.

From the viewpoint of the balance of crosslinking, the formulation amount of the component (c) is such an amount that the number of the SiH bonds of the component (c) becomes 0.5 to 5.0-fold based on the total number of the alkenyl groups of the component (a) and the component (b), and preferably an amount which becomes 0.7 to 3.0-fold.

In the component (c), the SiH bonds contained in one molecule of two or more (usually 2 to 200), preferably 3 or more (for example, 3 to 100), and more preferably about 4 to 50 may be located at either of the terminal(s) of the molecular chain or in the middle of the molecular chain, or may be located at both of these portions.

The molecular structure of the component (c) may be any of linear, cyclic, branched, and three-dimensional network structures. The number of silicon atoms (or degree of polymerization) in one molecule of the component (c) is usually 2 to 200, preferably 3 to 100, and more preferably about 4 to 50.

In the average composition formula (2), $R^4$ represents a monovalent hydrocarbon group containing no alkenyl group, and among these, those having 1 to 10 carbon atoms, particularly those having 1 to 8 carbon atoms are preferable. Such $R^4$ may be specifically mentioned an alkyl group such as a methyl group, an ethyl group, a propyl group, an isopropyl group, a butyl group, an isobutyl group, a tert-butyl group, a pentyl group, a neopentyl group, a hexyl group, a cyclohexyl group, an octyl group, a nonyl group, a decyl group and the like; an aryl group such as a phenyl group, a tolyl group, a xylyl group, a naphthyl group and the like; an aralkyl group such as a benzyl group, a phenylethyl group, a phenylpropyl group and the like, and particularly preferably a methyl group or a phenyl group.

The organohydrogen polysiloxane represented by the average composition formula (2) may be mentioned, for example, 1,1,3,3-tetramethyldisiloxane, 1,3,5,7-tetra-methylcyclotetrasiloxane, tris(hydrogen dimethylsiloxy)-methylsilane, tris(hydrogen dimethylsiloxy)phenylsilane, methylhydrogen cyclopolysiloxane, methylhydrogen siloxane/dimethylsiloxane cyclic copolymer, both terminals trimethylsiloxy group-sealed methyl hydrogen polysiloxane, both terminals trimethylsiloxy group-sealed dimethyl-siloxane/methylhydrogen siloxane copolymer, both terminals dimethylhydrogen siloxy group-sealed dimethylpolysiloxane, both terminals dimethylhydrogen siloxy group-sealed methyl hydrogen polysiloxane, both terminals dimethylhydrogen siloxy group-sealed dimethylsiloxane/methylhydrogen siloxane copolymer, both terminals trimethylsiloxy group-sealed methylhydrogen siloxane/diphenylsiloxane copolymer, both terminals trimethylsiloxy group-sealed methylhydrogen siloxane/diphenylsiloxane/dimethylsiloxane copolymer, both terminals trimethylsiloxy group-sealed methylhydrogen siloxane/methylphenylsiloxane/dimethylsiloxane copolymer, both terminals dimethylhydrogen siloxy group-sealed methylhydrogen siloxane/dimethylsiloxane/diphenylsiloxane copolymer, both terminals dimethylhydrogen siloxy group-sealed methylhydrogen siloxane/dimethylsiloxane/methylphenylsiloxane copolymer, a copolymer comprising a $(CH_3)_2HSiO_{1/2}$ unit, a $(CH_3)_3SiO_{1/2}$ unit and an $SiO_{4/2}$ unit, a copolymer comprising a $(CH_3)_2HSiO_{1/2}$ unit and an $SiO_{4/2}$ unit, a copolymer comprising a $(CH_3)_2HSiO_{1/2}$ unit, an $SiO_{4/2}$ unit and a $(C_6H_5)_3SiO_{1/2}$ unit, and those a part or all of the methyl group(s) in the respective exemplary compounds is/are substituted by a phenyl group(s) and the like.

Specific examples of the component (c) may be mentioned a linear organohydrogen polysiloxane and a cyclic organohydrogen polysiloxane represented by the following formulae, $$Me_3SiO(MeHSiO)_e SiMe_3$$

$$Me_3SiO(MeHSiO)_e(Me_2SiO)_f SiMe_3$$

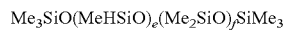

wherein, each of "e" and "f" represents an integer of 2 to 100, preferably 2 to 50,

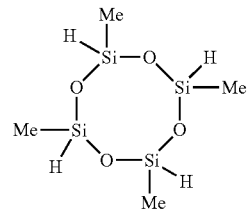 [SMILES: C[SiH]1O[SiH](C)O[SiH](C)O[SiH](C)O1]

[Component (d)]

The component (d) is a platinum group metal catalyst, and the component (d) is a component acting as a reaction catalyst for accelerating the reaction (hydrosilylation reaction) between the component (a) and the component (b), and the component (c).

As the platinum group metal catalyst, any catalyst known as a hydrosilylation reaction catalyst can be used. There may be mentioned, for example, a platinum group metal simple substance such as platinum black, rhodium, palladium, and the like; platinum chloride, chloroplatinic acid, and a chloroplatinate such as $H_2PtCl_4 \cdot kH_2O$, $H_2PtCl_6 \cdot kH_2O$, $NaHPtCl_6 \cdot kH_2O$, $KHPtCl_6 \cdot kH_2O$, $Na_2PtCl_6 \cdot kH_2O$, $K_2PtCl_4 \cdot kH_2O$, $PtCl_4 \cdot kH_2O$, $PtCl_2$, $Na_2HPtCl_4 \cdot kH_2O$ (wherein, k is an integer of 0 to 6, preferably 0 or 6) and the like; an alcohol-modified chloroplatinic acid (see U.S. Pat. No. 3,220,972); a complex of chloroplatinic acid and an olefin (see U.S. Pat. Nos. 3,159,601, 3,159,662, and 3,775,452); a material in which a platinum group metal such as platinum black and palladium is carried on a carrier such as alumina, silica, carbon, and the like; a rhodium-olefin complex; chlorotris(triphenylphosphine) rhodium (Wilkinson's catalyst); a complex of platinum chloride, chloroplatinic acid, or a chloroplatinate with a vinyl group-containing siloxane, in particular, with a vinyl group-containing cyclic siloxane, and the like. Among these, as a preferred material, a material in which chloroplatinic acid is modified with a silicone may be mentioned from the viewpoints of compatibility and chlorine impurities, and more specifically, for example, a platinum catalyst in which chloroplatinic acid is modified with tetramethylvinyldisiloxane.

The formulation amount of the component (d) is a so-called effective amount, and specifically, it is 1 to 500 ppm, preferably 3 to 100 ppm, more preferably 5 to 40 ppm in terms of the mass of the metal atoms based on the total amount of the components (a) to (c).

[Component (e)]

The component (e) is a polyorganometallosiloxane containing an Si—O—Ce bond, and an Si—O—Ti bond, a Ce content of which is 50 to 5,000 ppm, a Ti content of which is 50 to 5,000 ppm, and having a viscosity at 25° C. of 10 to 10,000 mPa·s, and the component (e) is an additive to improve heat resistance of the addition curable type silicone resin composition of the present invention. The process for producing the polyorganometallosiloxane of the component (e) will be described later.

The formulation amount of the component (e) is 0.01 to 5 parts by mass, preferably 0.1 to 3 parts by mass, more preferably 0.5 to 3 parts by mass based on 100 parts by mass in total of the components (a) to (d). If the formulation amount of the component (e) exceeds 5 parts by mass, there is a fear that the obtained addition curable type silicone resin composition discolors or the hardness of the cured product is lowered. If the formulation amount of the component (e) is less than 0.01 part by mass, sufficient heat resistance cannot be obtained.

[Other Components]

To the addition curable type silicone resin composition of the present invention, in addition to the components (a) to (e) which are essential components, other components exemplified below may be formulated, if necessary. The other components may be mentioned, for example, a thixotropic control agent such as fumed silica, and the like; a light scattering agent such as crystalline silica, and the like; a reinforcing material such as fumed silica, crystalline silica, and the like; a phosphor; a viscosity modifier such as a petroleum type solvent, a nonreactive silicone oil having no reactive functional group, and the like; an adhesion improver such as a carbon functional silane, a silicone compound having at least one of an epoxy group, an alkoxy group, a hydrogen atom bonded to a silicon atom (i.e., SiH bond) and an alkenyl group such as a vinyl group bonded to a silicon atom, and the like, other than the components (a) to (e), and the like; a conductivity imparting agent such as a metal powder of silver, gold, and the like; a pigment and a dye for coloring; a reaction inhibitor such as ethynylcyclohexanol, tetramethyl tetravinyl tetracyclosiloxane, and the like. These other components may be used a single kind alone, or two or more kinds may be used in combination.

The curing conditions of the addition curable type silicone resin composition of the present invention are not particularly limited, and it is preferable to set the conditions at 120 to 180° C. for 30 to 180 minutes.

Further, the addition curable type silicone resin composition of the present invention is preferably a material having a total light transmittance of a sheet having a thickness of 2 mm of a cured product at a wavelength of 400 nm of 80% or more, and a weight reduction ratio of the cured product after storage at 250° C. for 500 hours of within 10%. When such an addition curable type silicone resin composition is employed, it provides a cured product having transparency and heat resistance, which are particularly suitable for LED applications.

According to the addition curable type silicone resin composition of the present invention, it becomes an addition curable type silicone resin composition which gives a cured product excellent in transparency and heat discoloration resistance, having a suitable rubber hardness, having less change in hardness and weight loss under high temperature conditions, and having good crack resistance.

<Process for Producing Addition Curable Type Silicone Resin Composition>

In the present invention, it is also provided a process for producing the addition curable type silicone resin composition by mixing the components (a) to (e), wherein the component (e) is a polyorganometallosiloxane obtained by subjecting a mixture comprising (i) an organopolysiloxane having a viscosity at 25° C. of 10 to 10,000 mPa·s: 100 parts by mass, (ii) a rare earth carboxylate containing a cerium carboxylate represented by the following general formula (e-1): with an amount that a mass of cerium is 0.05 to 5 parts by mass based on 100 parts by mass of the component (i),

$$(R^5COO)_xCe \qquad (e\text{-}1)$$

wherein, each of $R^5$s represents the same or different kind of monovalent hydrocarbon group; and "x" is 3 or 4, and (iii) a titanium compound represented by the following general formula (e-2) and/or or its partial hydrolyzed condensate: with an amount that a mass of titanium is 0.05 to 5 parts by mass based on 100 parts by mass of the component (i),

$$(R^6O)_4Ti \qquad (e\text{-}2)$$

wherein, each of $R^6$s represents the same or different kind of monovalent hydrocarbon group, to heat treatment at a temperature of 150° C. or higher. The heat treatment temperature may be any temperature as long as the resin does not denature, and the upper limit is not particularly limited.

When such a producing method is employed, the polyorganometallosiloxane (i.e., the component (e)) containing predetermined amounts of the Ce content and the Ti content can be easily synthesized, so that the addition curable type silicone resin composition of the present invention can be easily produced.

<Optical Semiconductor Apparatus>

In addition, the present invention further provides an optical semiconductor apparatus in which a light emitting diode is sealed by the addition curable type silicone resin composition of the present invention. When such an optical semiconductor apparatus is employed, a light emitting diode is sealed by the addition curable type silicone resin composition of the present invention which gives a cured product having excellent transparency and less change in hardness and weight loss under high temperature conditions, so that it becomes an optical semiconductor apparatus excellent in reliability under high temperature conditions.

Thus, the addition curable type silicone resin composition of the present invention is particularly useful as a material for protecting and sealing LED devices, a material for changing and adjusting wavelengths, constituent materials of lenses, and other materials for optical devices or optical components.

EXAMPLES

In the following, the present invention will be specifically explained by referring to Synthesis Examples, Examples, and Comparative Examples, but the present invention is not limited by these.

Synthesis Example 1

Synthesis of Component (e)

To 100 parts by mass of dimethylpolysiloxane both terminals of which had been sealed by trimethylsiloxy groups and having a viscosity at 25° C. of 100 mPa·s was added a material in which 10 parts by mass (mass of cerium: 0.55 part by mass) of a turpentine solution of 2-ethylhexanoate comprising cerium as a main component (content of rate earth element: 6% by mass) and 2.1 parts by mass (mass of titanium: 1.65 parts by mass) of tetra-n-butyl titanate have previous been mixed while sufficiently stirring, to obtain a yellowish white dispersion. Turpentine was discharged therefrom by heating while flowing a small amount of nitrogen gas, and then, the mixture was heated at 300° C. for 1 hour to obtain a homogeneous composition of deep reddish brown transparent polyorganometallosiloxane (e1). The Ce content of the thus synthesized polyorganometallosiloxane (e1) was 3,400 ppm, the Ti content thereof was 3,700 ppm, and the viscosity thereof at 25° C. was 104 mPa·s.

Example 1

A linear dimethylpolysiloxane (a1) both terminals of which are sealed by vinyl groups and having a viscosity at 25° C. of 5,000 mPa·s, and a toluene solution of a solid state silicone resin (b1) constituted by an $Me_3SiO_{1/2}$ unit, a $ViMe_2SiO_{2/2}$ unit, and an $SiO_{4/2}$ unit, a molar ratio of the $Me_3SiO_{1/2}$ unit and the $ViMe_2SiO_{1/2}$ unit to the $SiO_{4/2}$ unit being 0.8, and an amount of the vinyl group based on the solid component being 0.085 mol/100 g were mixed with a ratio of the dimethylpolysiloxane (a1):the silicone resin (b1)=75:25 in a mass ratio in terms of the effective components. Toluene was removed from the mixture at 120° C. under reduced pressure of 10 mmHg (about 1.3 kPa) or lower, to obtain a liquid which is transparent at room temperature.

Next, with 100 parts by mass of the liquid were mixed 2.57 parts by mass of methyl hydrogen polysiloxane (c1) having an average composition formula (2): $R^4{}_aH_bSiO_{(4-a-b)/2}$ wherein, $R^4$ is a methyl group, a=1.4, b=0.8, and both terminals of which have been sealed by trimethylsiloxy groups and having a viscosity at 25° C. of 4.5 mPa·s, and as other components, 0.5 part by mass of 3-glycidoxypropyl-trimethoxysilane which is an epoxy group-containing compound, and 0.05 part by mass of ethynylcyclohexanol, to obtain a transparent liquid. The number of the SiH bonds of the methyl hydrogen polysiloxane (c1) based on the total number of the alkenyl groups of the dimethylpolysiloxane (a1) and the silicone resin (b1) was 1.50-fold.

Further, 1 part by mass of polyorganometallosiloxane (e1) obtained in Synthesis Example 1, and a platinum catalyst (d1), which is derived from chloroplatinic acid and has tetramethylvinyldisiloxane as a ligand, with such an amount that it becomes 5 ppm in terms of platinum atoms based on the total of the dimethylpolysiloxane (a1), the silicone resin (b1), and the methyl hydrogen polysiloxane (c1) were added thereto, and the mixture was uniformly mixed to obtain a transparent addition curable type silicone resin composition having a viscosity of 5,000 mPa·s.

Example 2

The same procedure as in Example 1 was carried out except for changing the formulation amount of the polyorganometallosiloxane (e1) obtained in Synthesis Example 1 to 2 parts by mass, to obtain a transparent addition curable type silicone resin composition having a viscosity of 4,800 mPa·s.

Example 3

A linear dimethylpolysiloxane (a2) both terminals of which have been sealed by three vinyl groups and having a viscosity at 25° C. of 100,000 mPa·s, and the similar toluene solution of the silicone resin (b1) to that used in Example 1 were mixed with a ratio of the dimethylpolysiloxane (a2):the silicone resin (b1)=40:60 in a mass ratio in terms of the effective components. Toluene was removed from the mixture at 120° C. and under reduced pressure of 10 mmHg (about 1.3 kPa) or lower to obtain a liquid which was transparent at room temperature.

Next, with 100 parts by mass of the liquid were mixed 9.2 parts by mass of methyl hydrogen polysiloxane (c2) having an average composition formula (2): $R^4{}_aH_bSiO_{(4-a-b)/2}$ wherein, $R^4$ is a methyl group, a=1.4, b=0.8, and both terminals of which have been sealed by trimethylsiloxy groups, and having a viscosity at 25° C. of 20 mPa·s, and as other components, 0.5 part by mass of the epoxy group-containing compound represented by the following formula, and 0.05 part by mass of ethynylcyclohexanol, to obtain a transparent liquid. The number of the SiH bonds of the methyl hydrogen polysiloxane (c2) based on the total number of the dimethylpolysiloxane (a2) and the silicone resin (b1) was 1.50-fold,

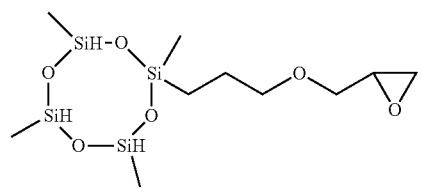

Further, 1 part by mass of the polyorganometallosiloxane (e1) obtained in Synthesis Example 1, and the similar platinum catalyst (d1) used in Example 1 with such an amount that it becomes 5 ppm in terms of platinum atoms based on the total of the dimethylpolysiloxane (a2), the silicone resin (b1), and the methyl hydrogen polysiloxane (c2) were added thereto, and the mixture was uniformly mixed to obtain a transparent addition curable type silicone resin composition having a viscosity of 5,000 mPa·s.

Example 4

A linear dimethylpolysiloxane (a3) both terminals of which have been sealed by vinyl groups and having a viscosity at 25° C. of 60 mPa·s, and the similar toluene solution of the silicone resin (b1) to that used in Example 1 were mixed with a ratio of the dimethylpolysiloxane (a3):the silicone resin (b1)=25:75 in a mass ratio in terms of the effective components. Toluene was removed from the mixture at 120° C. and under reduced pressure of 10 mmHg (about 1.3 kPa) or lower to obtain a liquid which was transparent at room temperature.

Next, with 100 parts by mass of the liquid were mixed 10 parts by mass of the similar methyl hydrogen polysiloxane (c1) used in Example 1, and as other components, 5.0 part by mass of the similar epoxy group-containing compound used in Example 3, and 0.05 part by mass of ethynylcyclohexanol, to obtain a transparent liquid. The number of the SiH bonds of the methyl hydrogen polysiloxane (c1) based on the total number of the alkenyl groups of the dimethylpolysiloxane (a3) and the silicone resin (b1) was 1.50-fold.

Further, 1 part by mass of polyorganometallosiloxane (e1) obtained in Synthesis Example 1, and the similar platinum catalyst (d1) used in Example 1 with such an amount that it becomes 5 ppm in terms of platinum atoms based on the total of the dimethylpolysiloxane (a3), the silicone resin (b1), and the methyl hydrogen polysiloxane (c1) were added thereto, and the mixture was uniformly mixed to obtain a transparent addition curable type silicone resin composition having a viscosity of 5,000 mPa·s.

Comparative Example 1

The same procedure as in Example 1 was carried out except for not adding the polyorganometallosiloxane (e1) obtained in Synthesis Example 1, a transparent addition curable type silicone resin composition having a viscosity of 5,100 mPa·s was obtained.

Comparative Example 2

The same procedure as in Example 3 was carried out except for not adding the polyorganometallosiloxane (e1) obtained in Synthesis Example 1, a transparent addition curable type silicone resin composition having a viscosity of 5,100 mPa·s was obtained.

Comparative Example 3

The same procedure as in Example 4 was carried out except for not adding the polyorganometallosiloxane (e1) obtained in Synthesis Example 1, a transparent addition curable type silicone resin composition having a viscosity of 5,100 mPa·s was obtained.

With regard to the addition curable type silicone resin compositions thus prepared, the following tests were carried out. The results of the tests are shown in Table 1.

(Measurement of Light Transmittance of Cured Products)

By using the addition curable type silicone resin compositions obtained in each Example and each Comparative Example, a sheet state cured product having a thickness of 2 mm was each prepared by heating at 150° C. for 1 hour. The total light transmittance (optical path length: 2 mm) of the obtained cured product at a wavelength of 400 nm was measured. The light transmittance at this time is set to be "initial".

(Measurement of Light Transmittance after Heat Resistance Test)

The cured product used for the measurement of the light transmittance was stored in an environment at 250° C. for 500 hours, and then, the total light transmittance at a wavelength of 400 nm was measured again.

(Measurement of Hardness of Cured Product)

By using the addition curable type silicone resin compositions obtained in each Example and each Comparative Example, Type A hardness or Shore D hardness of a cured product obtained by heating at 150° C. for 3 hours was measured. In Examples 1 and 2, and Comparative Examples 1, Type A hardness was measured, and in Examples 3 and 4, and Comparative Examples 2 and 3, Shore D hardness was measured. The hardness at this time is set to be "initial".

(Measurement of Hardness after Heat Resistance Test)

The cured product used for the measurement of the hardness was stored in an environment at 250° C. for 500 hours, and Type A hardness or Shore D hardness of the cured product was measured again. The rate of change in hardness was determined according to the following formula.

(Changed rate)=((Hardness after heat resistance test)÷(Initial hardness)×100)−100(%)

(Measurement of Weight Loss Ratio by Heat Resistance Test)

The initial weight of the cured product used for the measurement of the light transmittance was taken as 100, the weight after storage in an environment at 250° C. for 500 hours was measured, and the weight loss ratio was calculated by comparing by weight %.

TABLE 1

|  |  | Example | | | | Comparative Example | | |
| --- | --- | --- | --- | --- | --- | --- | --- | --- |
|  |  | 1 | 2 | 3 | 4 | 1 | 2 | 3 |
| Light transmittance (%) of cured product | Initial | 88 | 95 | 86 | 90 | 92 | 86 | 90 |
|  | After heat resistant test | 84 | 82 | 90 | 90 | 83 | Crack Measurement impossible | Crack Measurement impossible |
| Hardness of cured product (Type A hardness or shore D hardness) | Initial | A48 | A48 | D26 | D50 | A50 | D30 | D51 |
|  | After heat resistant test | A43 (−10%) | A44 (−8%) | D36 (+38%) | D65 (+30%) | A85 (+70%) | Crack Measurement impossible | Crack Measurement impossible |
| Weight (%) after heat resistant test (weight loss ratio) |  | 95 (5%) | 95 (5%) | 95 (5%) | 95 (5%) | 87 (13%) | 85 (15%) | 85 (15%) |

As shown in Table 1, in Examples 1 to 4 in which the component (e) was formulated into the addition curable type silicone resin compositions, cured products excellent in transparency, having less change in light transmittance and hardness after the heat resistance test, and less weight loss could be obtained. On the other hand, among Comparative Examples 1 to 3 in which no component (e) was formulated into the addition curable type silicone resin compositions, Comparative Example 1 was inferior in reliability because change in hardness and weight loss after the heat resistance test were remarkable, and in Comparative Example 2 and Comparative Example 3, the cured products were cracked after the heat resistance test so that it was impossible to measure light transmittance and hardness.

From the above results, according to the addition curable type silicone resin composition of the present invention, it can be clarified that it becomes an addition curable type silicone resin composition which provides a cured product excellent in transparency, and less change in hardness and weight loss under high temperature conditions.

It must be stated here that the present invention is not restricted to the embodiments shown by Examples. The embodiments shown by Examples are merely examples so that any embodiments composed of substantially the same technical concept as disclosed in the claims of the present invention and expressing a similar effect are included in the technical scope of the present invention.

What is claimed is:

1. An addition curable type silicone resin composition which comprises:
    (a) an organopolysiloxane having two or more alkenyl groups bonded to a silicon atom(s) in one molecule, and having a viscosity at 25° C. of 50 to 100,000 mPa·s,
    (b) an organopolysiloxane represented by the following average composition formula (1), and is a liquid having a viscosity at 25° C. of 1,000 mPa·s or more or a solid: an amount of the component (b) being more than 0 part by mass and less than 80 parts by mass based on 100 parts by mass of a total of the component (a) and the component (b),

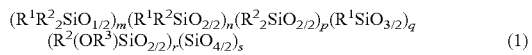

$$(R^1R^2{}_2SiO_{1/2})_m(R^1R^2SiO_{2/2})_n(R^2{}_2SiO_{2/2})_p(R^1SiO_{3/2})_q(R^2(OR^3)SiO_{2/2})_r(SiO_{4/2})_s \quad (1)$$

wherein, $R^1$ represents a monovalent hydrocarbon group which may contain an alkenyl group; $R^2$ represents a monovalent hydrocarbon group which does not contain an alkenyl group, and 80% or more of the whole $R^2$ is a methyl group; $R^1$ represents a hydrogen atom or an alkyl group; "m", "n", "p", "q", "r", and "s" are numbers satisfying m≥0, n≥0, p≥0, q≥0, r≥0, s≥0, and are numbers satisfying m+n>0, q+r+s>0, m+n+p+q+r+s=1,
    (c) an organohydrogen polysiloxane represented by the following average composition formula (2), having two or more SiH bonds in one molecule, and having a viscosity at 25° C. of 1,000 mPa·s or less: in an amount that a number of the SiH bonds of the component (c) being 0.5 to 5.0-fold based on a total of a number of the alkenyl groups of the component (a) and the component (b),

$$R^4{}_aH_bSiO_{(4-a-b)/2} \quad (2)$$

wherein, $R^4$ represents a monovalent hydrocarbon group which does not contain an alkenyl group, and 50% or more of the whole $R^4$ is a methyl group; and "a" and "b" are numbers satisfying 0.7≤a≤2.1, 0.001≤b≤1.0, and 0.8≤a+b≤3.0,
    (d) a platinum group metal catalyst: in an amount of 1 to 500 ppm in terms of a mass of metal atoms based on a total of the components (a) to (c), and
    (e) a polyorganometallosiloxane containing an Si—O—Ce bond, and an Si—O—Ti bond, a Ce content of which is 50 to 5,000 ppm, a Ti content of which is 50 to 5,000 ppm, and having a viscosity at 25° C. of 10 to 10,000 mPa·s: in an amount of 0.01 to 5 parts by mass based on 100 parts by mass of a total of the components (a) to (d),
    which cures by heating,
    wherein a total light transmittance of a sheet having a thickness of 2 mm of a cured product of the composition at a wavelength of 400 nm of 80% or more, and a weight reduction ratio of the cured product after storage at 250° C. for 500 hours of within 10%.

2. A process for producing the addition curable type silicone resin composition according to claim 1 by mixing the components (a) to (e), wherein the component (e) is a polyorganometallosiloxane obtained by subjecting a mixture comprising:
    (i) an organopolysiloxane having a viscosity at 25° C. of 10 to 10,000 mPa·s: 100 parts by mass,
    (ii) a rare earth carboxylate containing a cerium carboxylate represented by the following general formula (e-1): with an amount that a mass of cerium is 0.05 to 5 parts by mass based on 100 parts by mass of the component (i),

$$(R^5COO)_xCe \quad (e-1)$$

wherein, each of $R^5$s represents the same or different kind of monovalent hydrocarbon group; and "x" is 3 or 4, and
    (iii) a titanium compound represented by the following general formula (e-2) and/or or its partial hydrolyzed condensate: with an amount that a mass of titanium is 0.05 to 5 parts by mass based on 100 parts by mass of the component (i),

$$(R^6O)_4Ti \quad (e-2)$$

wherein, each of $R^6$s represents the same or different kind of monovalent hydrocarbon group,
    to heat treatment at a temperature of 150° C. or higher.

3. An optical semiconductor apparatus which comprises a light emitting diode sealed by the addition curable type silicone resin composition according to claim 1.

4. The addition curable type silicone resin composition according to claim 1, wherein component (a) is selected from the group consisting of $ViR_2SiO(SiR_2O)_dSiR_2Vi$, $ViR_2SiO(SiRViO)_c(SiR_2O)_dSiR_2Vi$, $Vi_2RSiO(SiR_2O)_dSiRVi_2$, $Vi_3SiO(SiR_2O)_dSiVi_3$, $Vi_2RSiO(SiRViO)_c(SiR_2O)_dSiRVi_2$, $Vi_3SiO(SiRViO)_c(SiR_2O)_dSiVi_3$, and $R_3SiO(SiRViO)_c(SiR_2O)_dSiR_3$,
    wherein Vi represents a vinyl group; R represents a monovalent hydrocarbon group containing neither an aliphatic unsaturated group nor an aryl group; c is an integer of 0 to 5; and d is an integer of 0 to 200.

5. The addition curable type silicone resin composition according to claim 4, wherein component (a) is selected from the group consisting of $ViMe_2SiO(Me_2SiO)_{20}SiMe_2Vi$, $ViMe_2SiO(Me_2SiO)_{90}SiMe_2Vi$, $ViMe_2SiO(MeViSiO)_1(Me_2SiO)_{19}SiMe_2Vi$, and $Me_3SiO(MeViSiO)_2(Me_2SiO)_{18}SiMe_3$.

6. The addition curable type silicone resin composition according to claim 1, wherein the viscosity of component (a) is 1,000 to 50,000 mPa·s.

7. The addition curable type silicone resin composition according to claim 1, wherein the viscosity of component (a) is 1,000 to 10,000 mPa·s.

8. The addition curable type silicone resin composition according to claim 1, wherein the amount of component (b) is more than 0 part by mass and less than 50 parts by mass based on 100 parts by mass of a total of the component (a) and the component (b).

9. The addition curable type silicone resin composition according to claim 1, wherein the amount of component (b) is 50 part by mass or more and less than 80 parts by mass based on 100 parts by mass of a total of the component (a) and the component (b).

10. The addition curable type silicone resin composition according to claim 1, wherein component (c) is at least one of Me$_3$SiO(MeHSiO)$_e$SiMe$_3$, Me$_3$SiO(MeHSiO)$_e$(Me$_2$SiO)$_f$SiMe$_3$, wherein each of e and f represents an integer of 2 to 100, or

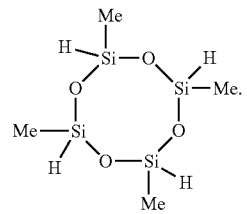 [SMILES: C[SiH]1O[SiH](C)O[SiH](C)O[SiH](C)O1]

11. The addition curable type silicone resin composition according to claim 1, wherein component (e) is present in an amount of in an amount of 0.1 to 3 parts by mass based on 100 parts by mass of a total of the components (a) to (d).

12. The addition curable type silicone resin composition according to claim 1, wherein component (e) is present in an amount of in an amount of 0.5 to 3 parts by mass based on 100 parts by mass of a total of the components (a) to (d).

* * * * *